United States Patent [19]
Böhme et al.

[11] 3,988,683
[45] Oct. 26, 1976

[54] METHOD AND APPARATUS FOR GENERATING A SWITCHING SIGNAL USING ODD AND EVEN HARMONICS AND COMPARISON OF RECTIFIED HARMONICS TO RATIO POTENTIAL

[75] Inventors: Rudolf Böhme, Wetzlar; Klaus Heinecke, Braunfels; Fromund Hock, Wetzlar, all of Germany

[73] Assignee: Ernst Leitz G.m.b.H., Germany

[22] Filed: Mar. 4, 1975

[21] Appl. No.: 555,248

Related U.S. Application Data

[63] Continuation-in-part of Ser. No. 418,270, Nov. 23, 1973, abandoned.

[30] Foreign Application Priority Data

Nov. 27, 1972 Germany............................ 2258025

[52] U.S. Cl. .................................... 328/61; 328/16; 328/133; 328/138; 328/140; 328/167; 250/232
[51] Int. Cl.² .................... H03K 1/00; H03D 13/00; H03K 5/20
[58] Field of Search ........................ 328/16, 59–61, 328/133, 138, 140, 167; 250/232

[56] References Cited
UNITED STATES PATENTS

| 3,454,776 | 7/1969 | Hock | 250/232 |
| 3,502,415 | 3/1970 | Hock | 250/232 |
| 3,555,435 | 1/1971 | Vosteen | 328/167 X |
| 3,659,116 | 4/1972 | Sellers et al. | 328/167 X |
| 3,699,461 | 10/1972 | Huntsinger | 328/167 X |
| 3,731,188 | 5/1973 | Smith | 328/167 X |

Primary Examiner—Stanley D. Miller, Jr.
Attorney, Agent, or Firm—Gilbert L. Wells

[57] ABSTRACT

A method for generating switching signals from an alternating current containing a harmonic or from a mixture of at least two alternating currents containing harmonics with adjacent fundamentals, characterized in that one even and one odd harmonic is filtered from the frequency range, then they are amplified, rectified and compared, and a switching signal is generated when a given and adjustable ratio is achieved between these two potentials, for instance when the ratio is unity.

4 Claims, 5 Drawing Figures

METHOD AND APPARATUS FOR GENERATING A SWITCHING SIGNAL USING ODD AND EVEN HARMONICS AND COMPARISON OF RECTIFIED HARMONICS TO RATIO POTENTIAL

CROSS REFERENCE TO RELATED APPLICATIONS

The present application is a Continuation-In-Part of application Ser. No. 418,270, filed Nov. 23, 1973, now abandoned.

Applicants claim priority under 35 U.S.C. 119 for Application P 22 58 025.2, filed Nov. 27, 1972, in the Patent Office of the Federal Republic of Germany. A copy of the priority document is contained in the file of application Ser. No. 418,270, now abandoned.

BACKGROUND OF THE INVENTION

The invention relates to a method for generating switching signals from AC current containing harmonics or from a mixture of at least two AC currents with harmonics and of adjacent fundamentals. Such currents may occur for instance when the positions of index marks are determined in one or several coordinates by means of periodic photoelectric scanning, each measured coordinate being associated with a fundamental frequency and the scanning signal being analysed by one or several discriminators.

There are three null values in the output signal of a discriminator, for instance in a photoelectric scanning circuit, as shown in West German Pat. Nos. 1,265,435 of F. Hock, published May 13, 1971 and 1,448,854 of K. Heinecke and W. Holle, published Aug. 23, 1970, the disclosures of which are incorporated herein, namely, one prior to and one after a measured index mark being in the range of scanning and one intermediate one, the latter representing coincidence between an index mark and a reference value. As regards the technique of measurement, it is only this latter null transit which is of interest, and the problem consists in distinguishing it from the others. This may be achieved in known manner by indexing only this particular null process by a switching signal restricted to the range of this particular null transition.

It is known this display signal is so connected logically with the output signal of the discriminator that there is no signal at the output of the latter from beyond the sensitivity range of the scanning device, that is, no interferences of any kind may be transmitted, such as transients, stray pulses, etc., which represents a considerable advantage for automatic measuring instruments or systems.

A method already known according to U.S. Pat. No. 3,454,776 where generation of the switching signals is based on the fact that the transition of an indexing mark through the scanning range results in a scanning signal frequency function $f \rightarrow 2f \rightarrow f$. The discriminator null transition of interest is in the $2f$-range indicated by the frequency measurement.

The apparatus used in this prior art method suffers from its sensitivity to interferences, for instance noise superposed on the measured signal. In order to ensure that this apparatus will not respond to such interferences, hysteresis must be incorporated. The latter in turn reduces sensitivity and therefore such a system does not operate flawlessly below a certain amplitude of the scanned signal, for instance if the illumination is lowered during photoelectric scanning. The method furthermore suffers from the drawback of becoming inoperative if more than one fundamental is present in the scanned signal. Therefore, one may not achieve switching signals for two or more coordinates from correspondingly mixed frequencies when making use of such systems.

SUMMARY OF THE INVENTION

Having in mind the limitations of the prior art, it is therefore an object of the present invention to provide a new method for eliminating the drawbacks mentioned above and of furthermore creating an apparatus for implementing this method.

This object is achieved by means of a method of the kind initially described, which is characterized in filtering each time an even and odd harmonic from one or several fundamentals, in amplifying, rectifying and comparing them, and in generating a switching signal when a given, adjustable ratio is obtained between these two potentials, for instance for unity. Ratio formation advantageously makes use of the first and second harmonics.

A system for implementing the novel method is characterized in a signal source, for instance a photoelectric receiver, being connected via a matching amplifier to at least two amplifiers and rectifiers, the outputs of these rectifiers being connected to the inputs of a comparator providing the switching signal at its output.

BRIEF DESCRIPTION OF THE DRAWINGS

The novel method is best explained by reference to the drawings appended hereto, wherein:

FIG. 2b is a graphical representation of the outputs of a, b and c of elements 5–7 of FIG. 2a according to the position of index mark 16a.

DESCRIPTION OF THE PREFERRED EMBODIMENTS

Figure 1:
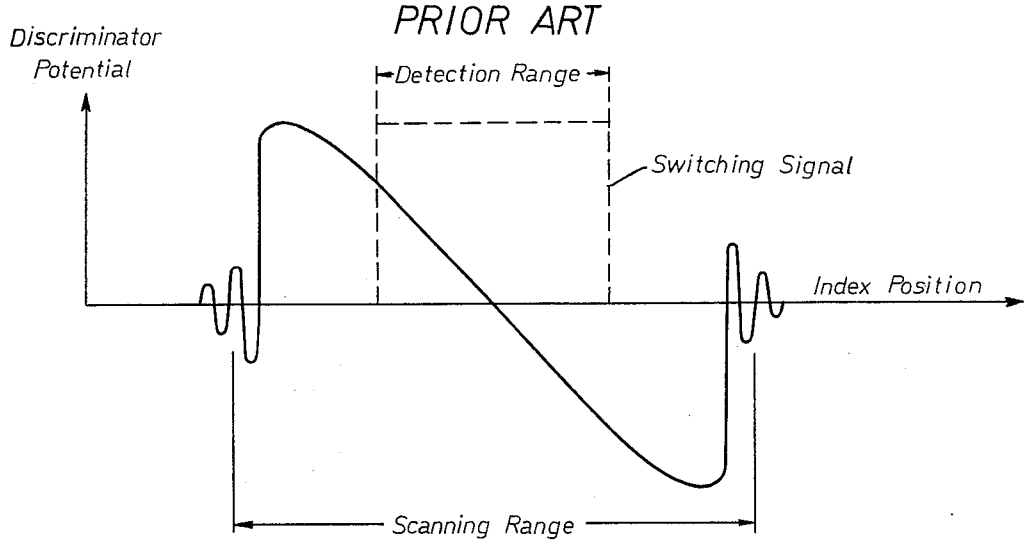
FIG. 1 is a graphical representation showing the prior art output signal of a discriminator of a photoelectric scanning system.

For the sake of clarity, FIG. 1 again shows the discriminator output signal of the photoelectric scanning system disclosed in U.S. Pat. No. 3,454,776.

Figure 2:
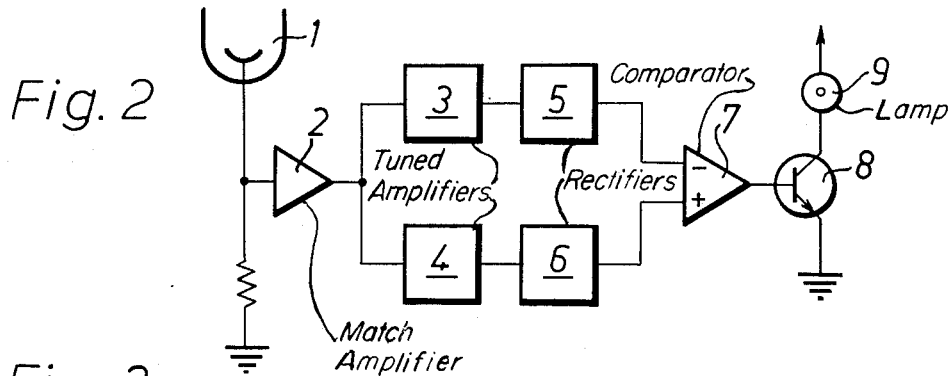
FIG. 2 is a diagrammatic representation of an illustrative system for implementing the method of the present invention as regards one measurement coordinate.
Figure 3:
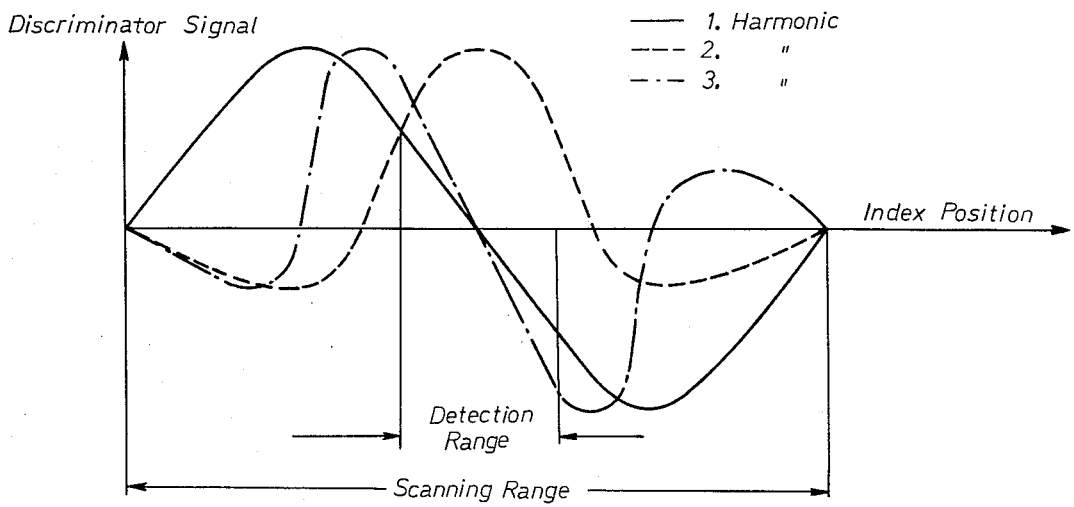
FIG. 3 is a graphical representation showing the harmonics of a discriminator signal during transition of a measured object according to the present invention.

As shown in FIG. 2, a photomultiplier 1 feeds a mixed signal to matching amplifier 2, where said signal contains one or several fundamentals and corresponding harmonics. When an object to be detected or measured passes through the system's scanning range, the amplitudes of the various frequency components of the mixed signal change, as illustrated in FIG. 3. One odd and one even harmonic are separated, each through a tuned amplifier 3, 4. The DC potentials obtained from rectifiers 5,6 are switched to one of each of the inputs of a comparator 7. Whenever a predetermined amplitude ratio is obtained, for instance unity, comparator 7 changes its output state. In the example shown, this is displayed by lamp 9 fed from transistor 8. The comparator output signals are used in known manner, for instance for control purposes.

In deviation from the state of the art, use is therefore made of the amplitude ratio between an even and an odd, for instance between the second and first harmonics, for generating the switching signals.

Figure 2A:
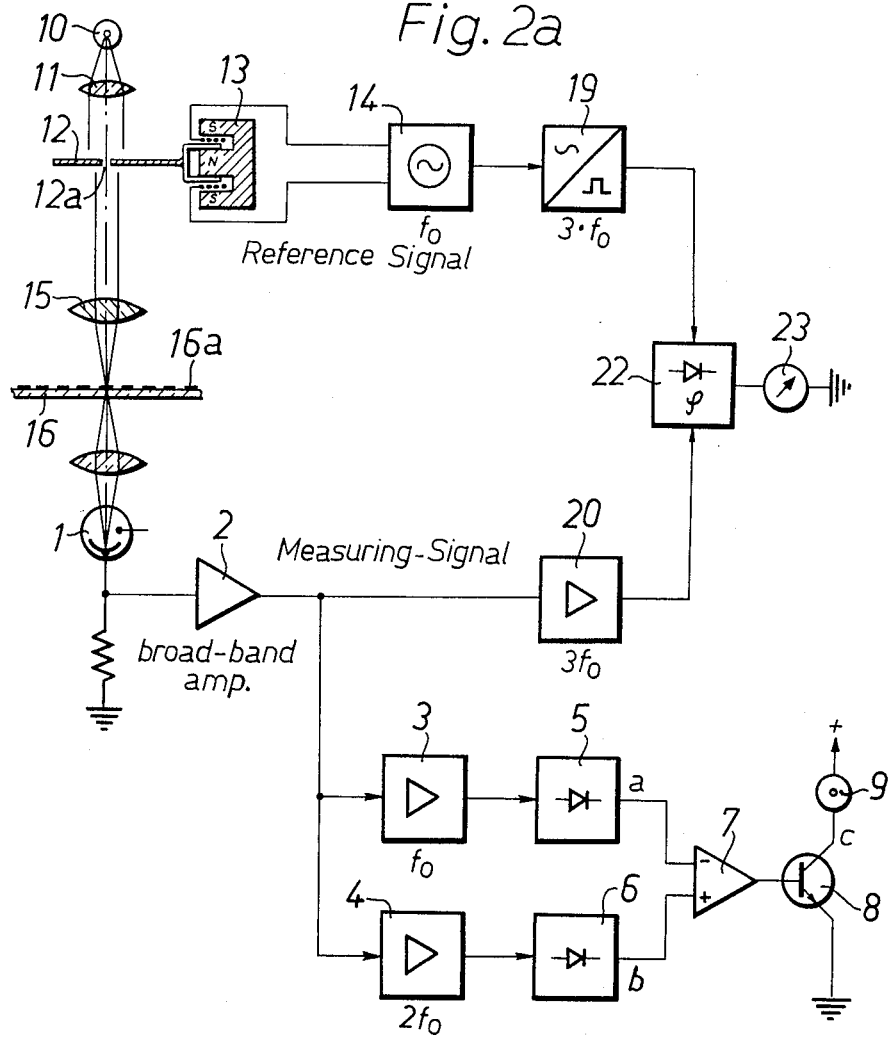
FIG. 2a is a diagram, principally in block form, of an embodiment of the invention.

FIG. 2a, to which reference is now made, shows apparatus in accordance with the invention for determining the location of a marking in one coordinate. This arrangement comprises a diaphragm 12, provided with a slit 12a which is illuminated by a lamp 10 via a condensing lens 11. Oscillatory motions of the diaphragm are produced by a magnetic system 13 comprising a concentric magnet and a coil movable within the annular gap separating the poles of the magnet. This coil is supplied with an alternating signal of frequency $f_o$ from a generator 14.

The illuminated slit 12a is imaged via objective 15 upon indicia bearing object 16 and thence upon a photoelectric receptor 1 which senses and transforms into electrical signals the light signal modulated by the indicia of object 16.

A square wave generator 19 is also connected to the output of generator 14. The square wave generator has the purpose of enhancing the high frequency content of the generator output signal and of tripling its frequency. The output of the photoelectric receptor 1 is applied via a broad band amplifier 2 to a frequency selective amplifier 20 which is made transmissive (e.g. by tuning) of signal components at a frequency $3f_o$. A phase sensitive rectifier or detector 22 mixes the output signals of the square wave generator 19 and the tuned amplifier 20 and drives a null-indicating meter or similar instrument 23 which, for precise photometric null-position of an indicium 16a relative to the oscillating image of slit 12a, produces no signal indication.

If, however, the indicium is respectively to the right or to the left of the central position of the image of slit 12a, the instrument 23 produces respectively a positive or negative indication.

The arrangement so far described is shown in U.S. Pat. No. 3,454,776. Evaluating the third harmonic to obtain the measurement signal one thus gets three null-transitions of said signal while an indicium is passing the catchment range of the apparatus. The second null-transition occuring at coincidence of the aiming axis with the indicium it is an object of the present invention to distinguish the region of this transition in a convenient manner from the other null-transitions.

Figure 2B:
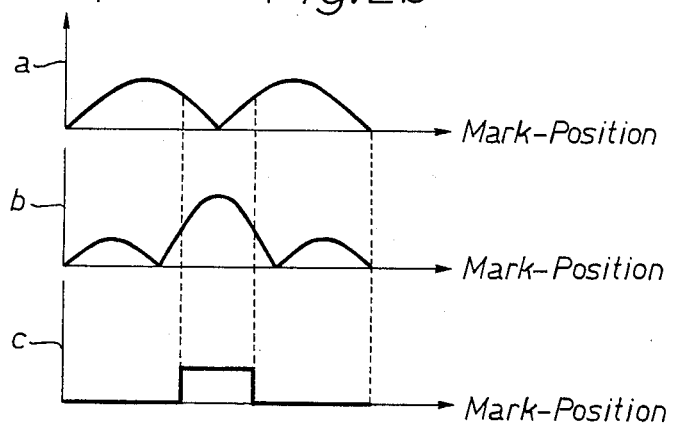

Therefore, the apparatus is improved by a switching circuit serving to indicate the presence of an indicium 16a near to the precise null position in order to avoid errors when such indicium is entering or leaving the scanning range. This switching circuit has already been described in detail with reference to FIG. 2. As may be seen from FIG. 2a, the output of the photoelectric receptor 1 is applied to amplifier 20 and additionally via broad band amplifier 2 to frequency selective amplifiers 3 and 4 which are made transmissive of signal components respectively at a frequency $f_o$ and $2f_o$. A rectifier 5 and 6 respectively is branched to amplifier 3 and 4 and the DC outputs of these two rectifiers are switched to one of each of the inputs of a comparator 7. Whenever a predetermined level ratio of the DC signals is obtained, for instance unity, comparator 7 changes its output state, corresponding to a predetermined amplitude ratio being attained between the first and second harmonic components of the photoelectric AC signal of receptor 1, of frequencies $f_o$ and $2f_o$. The output of comparator 7 is used in known manner for display or control purposes. It may be displayed by a lamp 9 fed via a transistor 8. The DC output of respectively rectifier 5 and 6 as well as the comparator output signal is illustrated in FIG. 2b as dependent on the position of an index mark 16a.

We claim:

1. A method for generating switching signals from an alternating current containing a harmonic or from a plurality of alternating currents each containing harmonics with adjacent fundamentals, comprising filtering at least one even and one odd harmonic from the frequency range, individually amplifying each harmonic, separately rectifying each amplified harmonic, commonly comparing said rectified harmonics in a single comparator adjusted to a given ratio potential and generating a switching signal when this ratio is achieved.

2. The method of claim 1, wherein said given adjustable ratio is unity.

3. The method of claim 1, wherein said ratio is formed from said first and second harmonics.

4. A circuit for generating switching signals from an alternating current containing a harmonic or from a plurality of alternating currents each containing harmonics with adjacent fundamentals comprising:
    means for generating signals (1) connected to means for amplifying (2) said signals;
    first amplifying means (3) for separating and amplifying from said signals one odd harmonic connected in series with first rectifying means (5) producing a first individual rectified signal;
    second amplifying means (4) for separating and amplifying from said signals one even harmonic, said second amplifying means connected in series with second rectifying means (6) producing a second individual rectified signals; and
    means consisting of a single comparator adjusted to a given ratio potential (7) for commonly comparing said first and said second rectified signal to generate said switching signal.

* * * * *